United States Patent
Hall

(10) Patent No.: US 9,793,002 B2
(45) Date of Patent: *Oct. 17, 2017

(54) FUSE ELEMENT PROGRAMMING CIRCUIT AND METHOD

(71) Applicant: SEMICONDUCTOR COMPONENTS INDUSTRIES, LLC, Phoenix, AZ (US)

(72) Inventor: Jefferson W. Hall, Chandler, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 28 days.

This patent is subject to a terminal disclaimer.

(21) Appl. No.: 15/073,121

(22) Filed: Mar. 17, 2016

(65) Prior Publication Data

US 2016/0196880 A1 Jul. 7, 2016

Related U.S. Application Data

(63) Continuation of application No. 14/225,272, filed on Mar. 25, 2014, now Pat. No. 9,324,448.

(51) Int. Cl.
| | |
|---|---|
| *G11C 17/18* | (2006.01) |
| *G11C 17/16* | (2006.01) |
| *H01L 27/112* | (2006.01) |
| *H01L 27/105* | (2006.01) |
| *H01L 23/522* | (2006.01) |
| *G11C 5/14* | (2006.01) |

(52) U.S. Cl.
CPC .............. *G11C 17/18* (2013.01); *G11C 17/16* (2013.01); *H01L 27/1052* (2013.01); *H01L 27/11206* (2013.01); *H01L 27/11293* (2013.01); *G11C 5/147* (2013.01); *H01L 23/5228* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,349,325 A * | 9/1994 | McAllister | H01L 28/20 257/536 |
| 5,640,137 A | 6/1997 | Mantha | |
| 5,789,970 A | 8/1998 | Denham | |
| 6,436,738 B1 | 8/2002 | Yu | |
| 6,667,537 B1 | 12/2003 | Koike et al. | |
| 7,265,629 B2 | 9/2007 | Manku | |
| 7,271,618 B2 | 9/2007 | Hsu | |
| 7,321,501 B2 | 1/2008 | Chen | |
| 7,405,590 B1 | 7/2008 | Kaneko | |
| 7,724,600 B1 | 5/2010 | Im et al. | |
| 7,911,820 B2 | 3/2011 | Anand et al. | |
| 8,150,886 B2 | 4/2012 | Rhodes et al. | |
| 9,324,448 B2 * | 4/2016 | Hall | G11C 17/16 |
| 2005/0052892 A1 | 3/2005 | Low et al. | |
| 2006/0052962 A1 | 3/2006 | Shipton et al. | |
| 2013/0077409 A1 | 3/2013 | Shiino et al. | |
| 2013/0286710 A1 | 10/2013 | Hall et al. | |

* cited by examiner

*Primary Examiner* — J. H. Hur

(74) *Attorney, Agent, or Firm* — Robert F. Hightower

(57) ABSTRACT

In one embodiment, a programming circuit is configured to form a programming current for a silicide fuse element by using a non-silicide programming element.

20 Claims, 5 Drawing Sheets

FUSE ELEMENT PROGRAMMING CIRCUIT AND METHOD

The present application is a continuation application of prior U.S. application Ser. No. 14/225,272, filed on Mar. 25, 2014, which is hereby incorporated herein by reference, and priority thereto for common subject matter is hereby claimed.

BACKGROUND OF THE INVENTION

The present invention relates, in general, to electronics, and more particularly, to semiconductors, structures thereof, and methods of forming semiconductor devices.

In the past, the semiconductor industry utilized various circuits and methods to form one-time programmable (OTP) memory circuits. Some of these memory circuits utilized a programmable resistor that could be programmed to an open circuit or remain as a resistive circuit to determine whether the output of a memory cell was a logical one or zero. Prior methods of programming a programmable resistor generally involved conducting a current through the programmable resistor to cause an open circuit or a change in resistance. The programming current often was formed by a current through another resistor that had similar construction as the memory element. Other implementations used a fixed external reference current to form the programming current. Programming the programmable element often resulted in under-programming which adversely affected yields and costs or over-programming which adversely affected yields or the reliability of the final circuit. In some applications, these reference circuits required a large area of the die which increased the costs. In some applications the programming current could vary as a temperature varied thereby causing unreliable programming which could result in increased costs or lower reliability.

Accordingly, it is desirable to have a circuit and method that can more reliably program the programmable element, and/or that provides compensation for temperature and/or process variations, and/or that provides compensation for applied stimulus.

Figure 1:
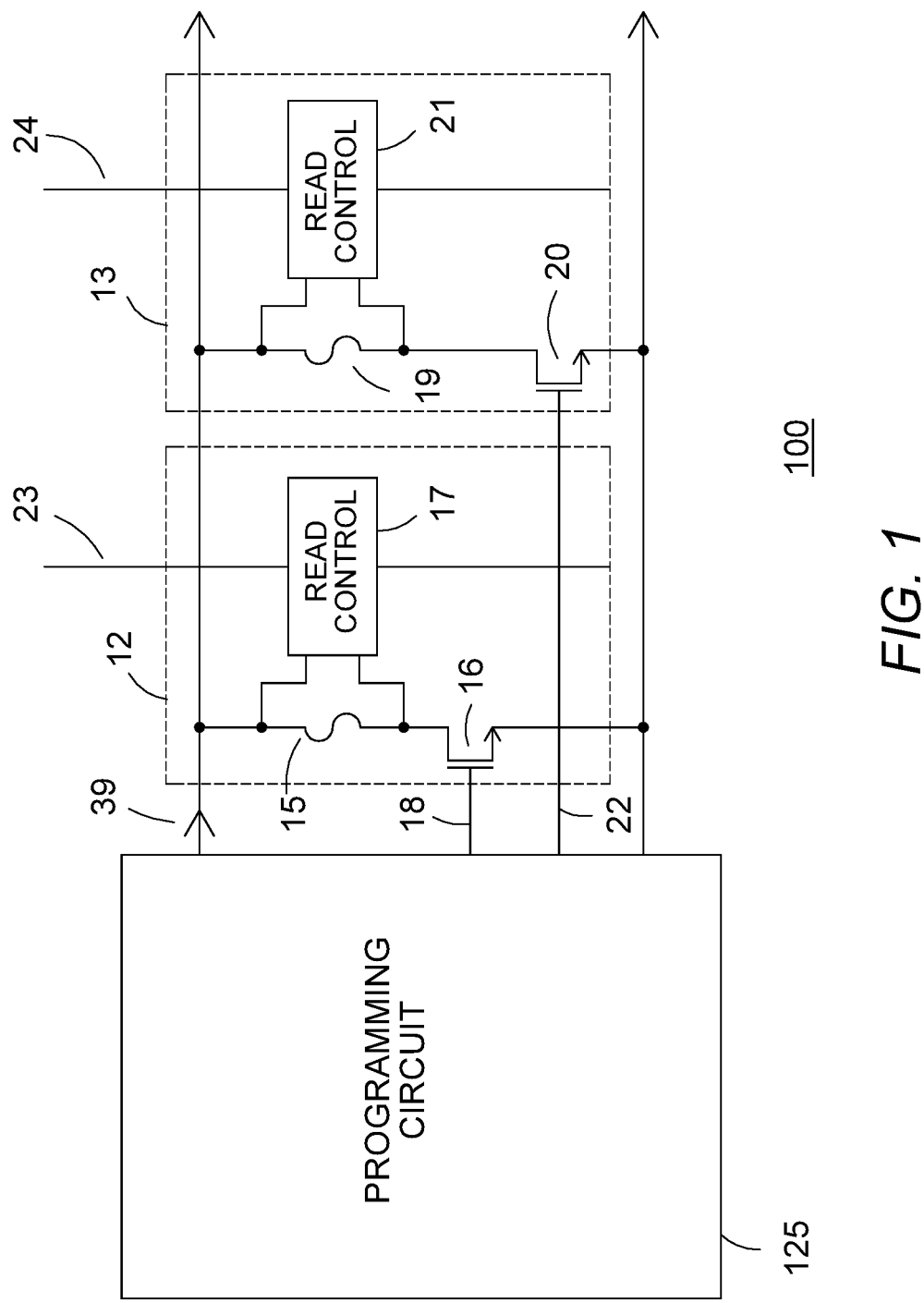
FIG. 1 schematically illustrates an example of an embodiment of a portion of a one-time programmable (OTP) memory system in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements are omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element my a carry current in one direction through a device, such as carry current entering the device, and a second current carrying element may carry current in an opposite direction through the device, such as carry current leaving the device. Although the devices are explained herein as certain N-channel or P-Channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, and that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

FIG. 1 schematically illustrates an example of an embodiment of a portion of a one-time programmable (OTP) memory system 100. System 100 includes a plurality of memory cells that are illustrated in a general manner by memory cells 12 and 13. Cells 12 and 13 include respective fuse elements 15 and 19 that are configured to be programmed to determine a logical state of the respective cells 12 and 13. Elements 15 and 19 are programmed by either causing a change or not causing a change in the resistance of elements 15 and 19. Cells 12 and 13 may also typically include programming select switches or select switches, such as the switches illustrated by example transistors 16 and 20. As is well understood by those skilled in the art, cells 12 and 13 typically include various other elements that are utilized to read or determine the state programmed into cells 12 and 13 such as respective read control circuits 17 and 21 that determines the state of or resistance of respective fuse elements 15 and 19. Cells 12 and 13 may also contain various other logical or passive elements, such as for example read select lines 23 and 24. Circuit 125 is configured to form a programming current 39 to program the state of elements 15 and 19 during a programming operation of system 100.

Figure 2:
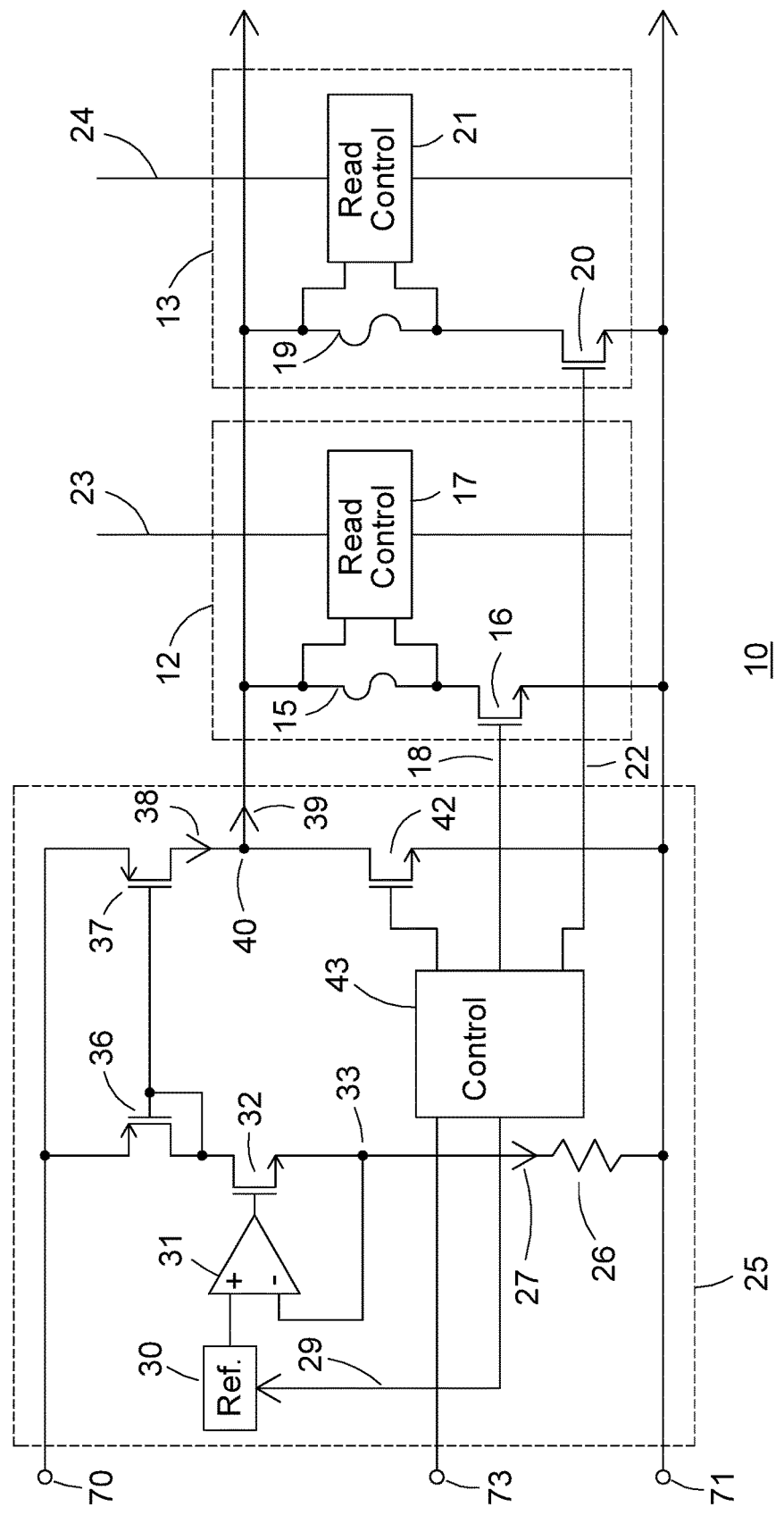
FIG. 2 schematically illustrates an example of an embodiment of a portion of a one-time programmable (OTP) system that is an alternate embodiment of the system of FIG. 1 in accordance with the present invention.

FIG. 2 schematically illustrates an example of an embodiment of a portion of an OTP memory system 10 that is an alternate embodiment of system 100. System 10 includes a programming circuit 25 that is an alternate embodiment of circuit 125. Circuit 25 is substantially similar to and forms current 39 to function similarly to circuit 125 but may have different internal circuitry than circuit 125.

Circuit 25 typically receives power for operating circuit 25 between a voltage input 70 and a voltage return 71. Return 71 may be connected to a common voltage reference such as a ground or other common reference value. The operating power received on input 70 may also be utilized for operating cells 12 and 13. Circuit 25 generally includes a control circuit 43 that is utilized to initiate programming of elements 15 and 19 and to select which memory cells will be programmed. In some embodiments, circuit 43 may receive a programming select signal on a control input 73 and may include outputs for select signals 18 and 22. In an embodiment, circuit 25 is configured to form a control current 27 and to form programming current 39 to be proportional to current 27. Circuit 25 includes a programming element 26 that is configured to control the value of current 27, thus, the value of current 39. In other embodiments, circuit 25 may be configured to form current 39 directly, for example using current 27 or other means of using element 26 to control the value of current 39. In some embodiments, the peak value of current 39 may be controlled.

In one embodiment, circuit 25 includes an amplifier 31 that receives a reference voltage from a reference generator 30 and controls a transistor 32 to form a voltage at a node 33 that is representative of the reference voltage from reference 30. An embodiment of circuit 25 includes a current mirror that includes transistors 36 and 37. Current 27 flows through transistor 36 which causes transistor 37 to form a current 38 to be proportional to the value of current 27 when current 38 has a low resistance conduction path to return 71. As is known to those skilled in the art, the proportionality between current 27 and current 38 is representative of the proportionally of the active areas of transistors 36 and 37.

When circuit 25 is not programming the memory cells, such as cells 12 and 13, the select switches, such as for example transistors 16 and 20, are disabled and a deselect switch, such as a transistor 42 for example, of circuit 25 is enabled which causes current 38 to flow through transistor 42 and not flow to the memory cells such as cells 12 and 13. Thus, current 39 is substantially zero. In some embodiments, circuit 25 may include an optional reference enable signal 29 to enable Ref. 30 only during a programming operation and not during other operations. This assists in reducing the power dissipation of circuit 25 and system 10 and increases reliability.

Figure 3:
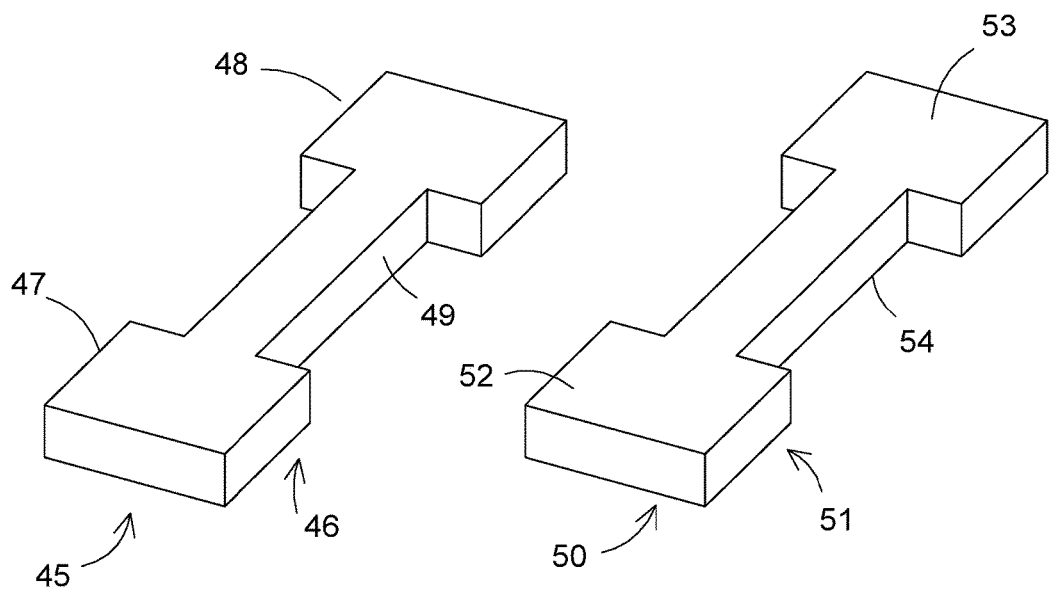
FIG. 3 illustrates an isometric view of an example of a portion of an embodiment of a programming element and a fuse element of the circuit of FIG. 2 at an intermediate stage of formation in accordance with the present invention.

FIG. 3 illustrates an isometric view of an example of a portion of an embodiment of a programming element 45 that is similar to programming element 26 and a fuse element 50 that is similar to one or both of fuse elements 15 and 19. FIG. 3 illustrates elements 45 and 50 at an intermediate stage in a method of forming elements 45 and 50. Element 45 typically is formed to include a body region 49 that is connected to contact areas 47 and 48 that are disposed at opposite ends of body region 49. Region 49 and areas 47 and 48 form a body layer 46 of element 45. Element 50 similarly includes a body region 54 that is connected to contact areas 52 and 53 that are disposed at opposite ends of body region 54. Region 54 and areas 52 and 53 form a body layer 51 of element 50. Body regions 49 and 54 typically are formed from a semiconductor material that has a substantially equal resistivity such that the resistivity of regions 49 and 54 are substantially equal. Areas 47 and 48 and 52 and 53 typically are formed from the same material as regions 49 to 54. A non-limiting example embodiment includes forming a layer of polysilicon or doped polysilicon as the semiconductor material and patterning the polysilicon to form body regions 49 and 54 and/or body layers 46 and 51. Thus, the thickness of regions 49 and 54 may be substantially similar in some embodiments. In one embodiment, the resistivity of the semiconductor material may be approximately 5E-3 to 9E-3 ohm-cm.

Those skilled in the art will appreciate that the total resistance of layers 46 and 51 usually is dominated by the resistance of respective regions 49 and 54 since regions 49 and 54 usually have a smaller cross-sectional area than, and in some embodiments may be longer than, respective areas 47/48 and 52/53.

Figure 4:
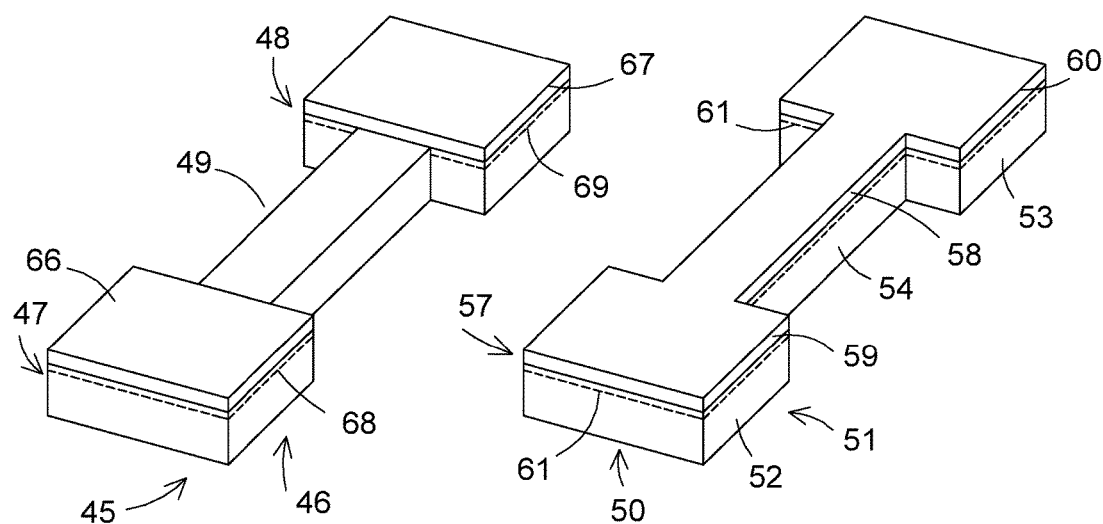
FIG. 4 illustrates another stage in a method of forming the elements of FIG. 4 in accordance with the present invention.

FIG. 4 illustrates another stage in a method of forming elements 45 and 50. A silicide material 58 is formed at least on body region 54 of element 50. The material used for silicide material 58 may be any of variety of well-known materials such as cobalt, titanium, or other suitable materials. In other embodiments, the silicide material may also be formed on areas 52 and 53 as illustrated by silicide material 59 and 60. For the embodiments that include material 59 and 60, material 59 and 60 may be formed simultaneously with material 58. Material 58, or alternately materials 58-60, forms a silicide layer 57 on the semiconductor material of layer 51 of element 50. Element 50 may be annealed to form layer 57 as a silicide alloy. In some embodiments, the silicide material may form an alloy with a small portion of the semiconductor material of layer 51 such as for example as is illustrated in a general manner by a dashed line 61. Those skilled in the art will appreciate that forming the silicide material on element 50 may reduce the thickness of the semiconductor material of body layer 51 since a portion of the semiconductor material may be used in forming the silicide alloy as illustrated by dashed line 61. Material 58 has a much lower resistivity and overall lower resistance than the material of region 54.

However, silicide material is not formed on at least body region 49 of element 45. In some embodiments, silicide material 66 and 67 may be formed on respective areas 47 and 48 to assist in making a low resistance contact to element 45. In other embodiments, silicide material 66 and 67 may be omitted, and in some embodiments silicide material may not be formed on any of element 45 such that layer 46 is substantially devoid of a silicide material. For the embodiments that include material 66 and 67, material 66 and 67 may be formed at the same time as material 58 and/or 58-60. Material 66 and 67 typically forms an alloy with a small portion of the semiconductor material of areas 47 and 48 similarly to the material of layer 57, such as illustrated by dashed lines 68 and 69. Therefore, the resistivity of region 49 and element 45 remains substantially representative of the resistivity of respective region 54 and layer 51 of element 50. By "representative of the resistivity" it is meant that the resistivity of the two regions or layers are substantially equally effected by variations in the manufacturing processes. For example, it is believed that variations in material properties or element dimensions or other process variations effect both elements substantially equally. Those skilled in the art will appreciate that even though the silicide material may cause a small reduction in the thickness of the material of layer 51, it is believed that the resistivity of body region 49 of element 45 remains substantially representative of the resistivity of body region 54 of element 50. For example, in one embodiment the resistivity of regions 49 and 54 was approximately 5E-3 to 9E-3 ohm-cm and the resistivity of element 50 including layer 57 was approximately 1E-4 to 2.5E-4 ohm-cm.

Referring back to FIG. 2, element 26 is formed substantially similar to element 45 and elements 15 and 19 are formed substantially similar to element 50. In order to program one of the memory cells, one of select lines 18 or 22 is asserted to select the corresponding one of cells 12 and 13, and transistor 42 is disabled. Assume for this example that cell 12 is to be programmed and signal 18 is asserted to enable transistor 16. Disabling transistor 42 allows current 38 to flow to the memory cells as current 39. Because transistor 16 is enabled, current 39 flows through fuse element 15. Circuit 25 is configured to control the value of current 39 to increase the resistivity and total resistance of element 15.

Figure 5:
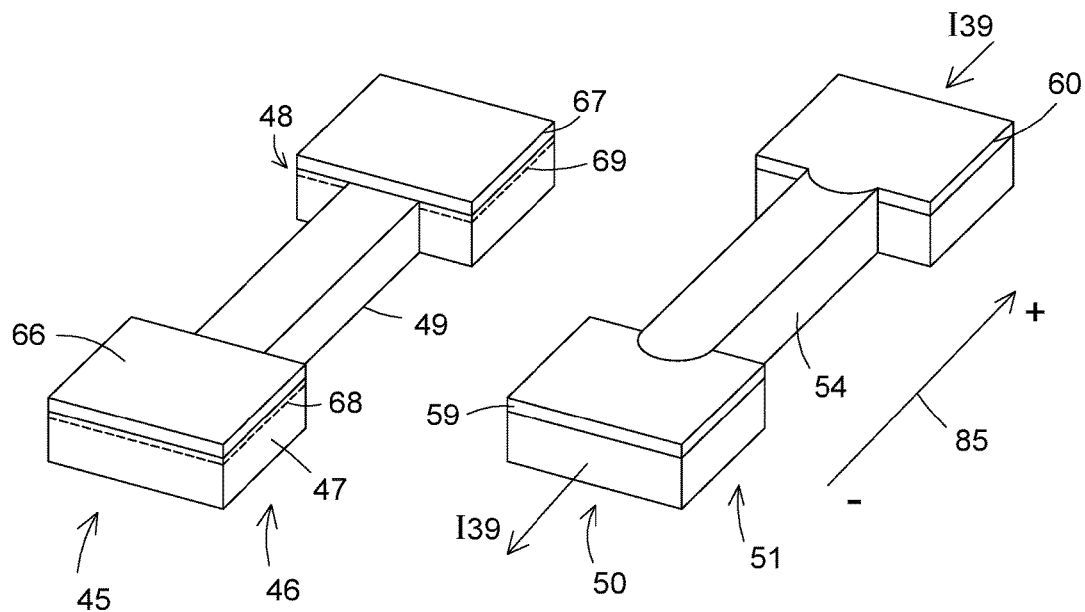
FIG. 5 illustrates the elements of FIG. 4 at various stages during the programming of a fuse element of FIG. 2 in accordance with the present invention.

FIG. 5 illustrates elements 45 and 50 at various stages during the programming of a fuse element that is illustrated by element 50, such as for example element 15 and/or element 19.

Figure 6:
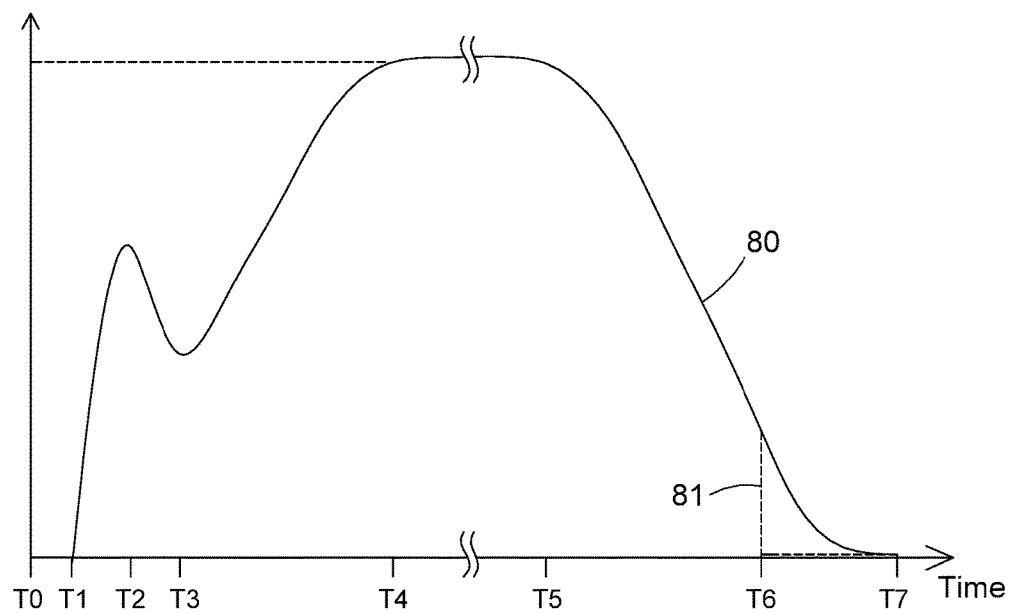
FIG. 6 is a graph having a plot that illustrates an example of an embodiment of a value of a programming current in accordance with the present invention.

FIG. 6 is a graph having a plot 80 that illustrates an example of an embodiment of a value of current 39. The abscissa indicates time and the ordinate indicates increasing value of the illustrated signal. A discontinuity in plot 80 indicates a non-uniformity in the time scale for the clarity of the drawings. This description has references to FIG. 2 and FIGS. 5-6. Assume that at a time T0, transistor 42 is enabled and current 39 is substantially zero. At a time T1, circuit 25 asserts one of signals 18 or 22 to begin programming the corresponding fuse element 15 or 19, and then disables transistor 42. Thus, current 38 flows to cell 12 or 13 as current 39 and through the selected one of transistors 16 or 20. Assuming that cell 12 is selected, current 39 flows through element 15 and transistor 16. Referring to FIG. 5, where element 50 is representative of element 15, current 39 flows through element 15 as illustrated by arrows in FIG. 5. As a result, a voltage is formed across element 50 as illustrated by an arrow 85 representing the voltage potential. Circuit 25 is configured to control the value of current 39 to a value that causes the resistance of element 15 to increase. An embodiment includes that circuit 25 is configured to control the value of current 39 to cause electro-migration of at least some of the silicide material away from region 54 thereby increasing the resistivity and total resistance of element 15. Another embodiment may include that circuit 25 is configured to control the value of current 39 to cause electro-migration of at least some of the dopant material and increase the resistance of element 15. Another embodiment may include that circuit 25 is configured to control the value of current 39 to cause electro-migration of at least some of the dopant material away from region 54, or in some embodiments away from at least a portion of region 54, thereby increasing the resistivity and total resistance of element 15.

Since layer 57 has a lower resistivity and resistance than layer 51, current 39 initially flows primarily through the silicide material of layer 57. In some embodiments the resistance of element 26 is formed to generate a much larger current density in layer 57 than in element 26. For embodiments that include the current mirror of transistors 36 and 37, the current mirror may assist in forming the two different current densities. For example, between time T1 and T2, current 39 flows primarily through layer 57 and causes heating of layer 57. The heating causes the resistance of layer 57 to increase and current 39 may decrease in response as illustrated between times T2-T3. Heating continues in element 50 and current 39 may increase such as illustrated between times T3-T4. Silicide material 58 may diffuse into in the body region of element 50. Silicide material 50, or in some embodiments at least a portion thereof, migrates to the more positive end of element 50 and accumulates with silicide material 60 in or on area 53 of element 50. In some embodiments, some of silicide material 59 may diffuse into a portion of area 52. At least a portion of silicide material 59 also begins to migrate from over area 52 toward the more positive end and is accumulated with material 60 in or on area 53 of element 50. In some embodiments, some of the silicide material may eventually accumulate near area 53, such as for example overly a small portion of region 54, as illustrated in FIG. 5 by a curved line.

From time T4 to T5, the value of current 39 is controlled by element 26, for example by the resistance of element 26. An embodiment may include controlling the peak value of current 39. Region 49 is formed to result in a value of current 39 that is sufficient to form a current density in region 54 that causes the electro-migration. The current density forms a local electric field in region 54 that is large enough to cause the electro-migration. Additionally, the value of current 39 is responsive to changes in the cross-sectional area of region 49. Thus, if the cross-sectional area changes, the current value changes responsively. In an embodiment, circuit 25 is configured to control the value of current 39 to a value that causes the resistance of element 15 to increase without forming a void in region 54. In an embodiment, the value of current 39 is controlled by element 26 so that the current density in region 54 forms a local electric field in body region 54 to cause the electro-migration of both the silicide material, and/or in some embodiments the dopants such as for example the atoms of the dopant material, toward area 53. In one example embodiment, the resistance of element 26 is formed to control the value of current 39 to form a local electric field of approximately 1E3 to 10E3 volts/cm in region 54. The value, and in some embodiments the peak value, of current 39 is selected to cause the migration of the silicide material, and/or in some embodiments the dopants, and to leave the semiconductor material in body region 54. An embodiment may include that the circuit 25 is configured to form the value of current 39 and the current density in region 54 to a value that forms substantially a void in layer 57 (FIG. 4) and substantially not a void in region 54. In one embodiment, circuit 25 is configured to form the value of current 39 to cause substantially a void in a portion of silicide material 58 of element 15 not a void in region 54. In one embodiment, substantially all of material 58 migrates toward area 53 and accumulates with material 60. The resistance of element 26 is chosen such that the value of current 39 is high enough to set a current density in region 54 to cause diffusion of the silicide atoms in layer 57 into the body region of element 50. An embodiment may include forming body region 49 to have a different cross-sectional area that body region 54 so that body region 26 may more accurately set the value of current 39 to cause the electro-migration. Another embodiment may include that the cross-sectional area of region 49 is larger than the cross sectional area of region 54. It is believed that the electro-migration causes the resistivity of region 54 to increase several orders of magnitude over the resistivity just prior to programming. As result of the electro-migration, current 39 then flows primarily through region 54, and the resistivity of region 54 substantially determines the resistivity and total resistance of element 15. Also as a result of the electro-migration, current 39 forms body region 54 to be substantially a non-silicide body region.

Prior reference elements that are formed from the same material as the fuse elements form a programming current that forms a very high current density, such as approximately 1E7 to approximately 1E8 amps/cm$^2$ in the body of the fuse element. Since prior reference elements and fuse elements were silicided, the silicide portion of the reference elements dominated the behavior of the current and of the reference elements. Also, it is believed that the current was not primarily responsive to the body portion of the reference element.

As the resistance of element 15 increases, the voltage at node 40 of circuit 25 increases which causes transistor 37 to conduct less current thereby reducing the value of current 39, such as illustrated between times T5 and T7 in FIG. 6. Because current 39 decreased, less current flows through element 15. In an embodiment, circuit 43 may be configured to terminate forming current 39 after a fixed time interval such as by terminating current 39 after the time interval. For example, after the time interval the deselect switch, such as transistor 42 for example, may be enabled, and the switch represented by transistor 16 may be disabled, to cause current 38 to flow through the deselect switch, for example as illustrated at a time T6. The time interval may be selected to allow sufficient time to increase the total resistance of element 15. In an embodiment, the time interval is selected to cause the migration of the silicide material. An embodiment may include that the lower value of current 39 substantially terminates the programming of element 15. An embodiment may include configuring circuit 25 to form programming current 39 with a first value, such as at time T4 for example, to increase the resistivity of element 15 and to decrease the value of current 39 to a second value, such as between times T5-T6 for example, responsively to forming the increased resistivity wherein the decreased value of current 39 is greater than zero. In other embodiments circuit 25 may be configured to monitor the value of current 39 and terminate programming once current 39 decreases from a first value, for example a value between T4 and just before T5, to a second value that is lower than the first value, such as a value between T5 and T7, indicating that the resistance of element 15 has increased. Those skilled in the art will appreciate that plot 80 is not to scale and includes a discontinuity between time T4-T5. In one embodiment, the time from T1-T4 had a magnitude in the nano-second range, the time from T4-T5 was a magnitude of micro-seconds or hundreds of micro-seconds, and the time from T5-T6 was a magnitude of hundreds of micro-seconds to milli-seconds.

Because the resistivity of body region 49 of element 26 is substantially representative of the resistivity of body region 54 of programming elements 15 and 19, the value of programming current 39 will track changes in elements 15 and 19 due to manufacturing or process variations because the resistivity of the body region of element 26 will change as the value of the resistivity of the body regions of elements 15 and 19 change. An embodiment may include forming body regions 49 and 54 to have substantially similar widths. It is believed that the substantially similar widths assist in regions 49 and 54 having substantially similar variations due to process variations and/or temperature variations. Additionally, the programming is configured to adjust for ambient temperature variations since temperature changes that affect elements 15 and 19 also affect element 26 and the value of element 26 sets the value of programming current 39.

Figure 7:
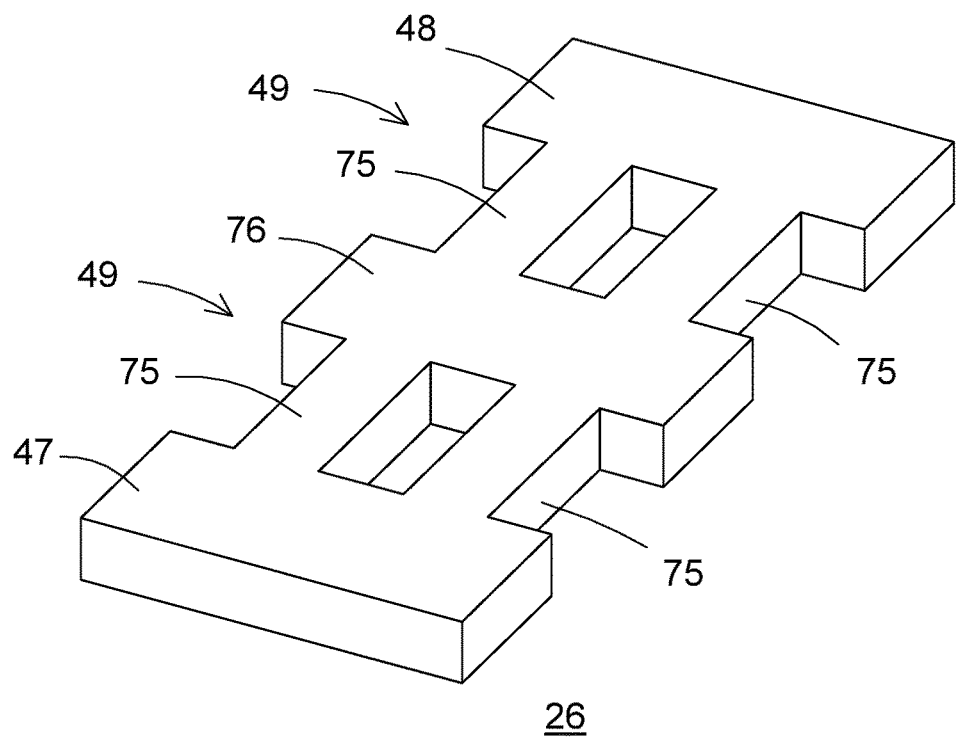
FIG. 7 illustrates an isometric view of an example of a portion of an alternate embodiment of some of the elements of FIG. 4 in accordance with the present invention.

FIG. 7 illustrates an isometric view of an example of a portion of an alternate embodiment of elements 26 and or 45. In an embodiment, element 26 may be formed to include a body region 49 that has a plurality of body region sections 75. Typically, sections 75 may be formed as a first plurality of parallel sections that are connected in series with a second plurality of parallel sections. The first and second parallel sections are connected together. In one embodiment, they may be connected together at a common contact area 76. In other embodiments, they may be connected together by conductors (not shown) that extend between the two sets of sections. The resistivity and total resistance of the plurality of sections 75 are substantially equal to the resistivity and total resistance of region 49. The plurality of sections 75 assists in reducing the variation in total resistance of element 26 due to process variations.

In order to assist in providing the functionality described herein, a first terminal of element 26 is connected to return 71 and a second terminal of element 26 is connected to node 33. Node 33 is commonly connected to a source of transistor 32 and an inverting input of amplifier 31. A non-inverting input of amplifier 31 is connected to an output of ref 30. An output of amplifier 31 is connected to a gate of transistor 32. A drain of transistor 32 is commonly connected to a drain of transistor 36, a gate of transistor 36, and a gate of transistor 37. A source of transistor 36 is connected to input 70 and to a source of transistor 37. A drain of transistor 37 is commonly connected to node 40 and to a drain of transistor 42. A source of transistor 42 is connected to return 71. A gate of transistor 42 is connected to an enable output of circuit 43. Node 40 is also connected to a first terminal of element 15 and a first terminal of element 19. A second terminal of element 15 is connected to a drain of transistor 16 which has a source connected to return 71. A second terminal of element 19 is connected to a drain of transistor 20 which has a source connected to return 71. A gate of transistor 16 is connected to select line 18 from circuit 43. A gate of transistor 20 is connected to select line 22 of circuit 43.

Figure 8:
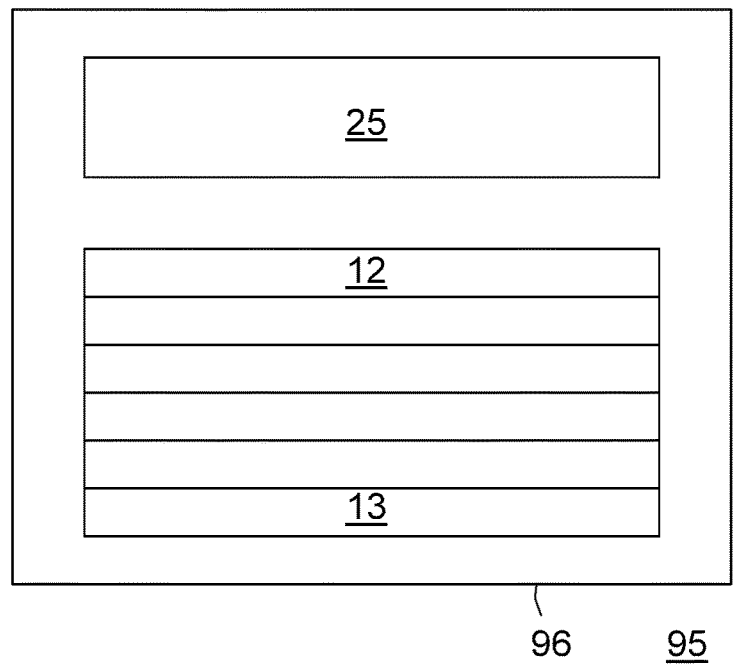
FIG. 8 illustrates an enlarged plan view of a semiconductor device that includes the circuit or system of FIG. 1 or FIG. 2 in accordance with the present invention.

FIG. 8 illustrates an enlarged plan view of a portion of an embodiment of a semiconductor device or integrated circuit 95 that is formed on a semiconductor die 96. Circuit 25 and/or cells 12 and 13 and/or system 10 may be formed on die 96. Die 96 may also include other circuits that are not shown in FIG. 8 for simplicity of the drawing. Circuit 25 and device or integrated circuit 95 are formed on die 96 by semiconductor manufacturing techniques that are well known to those skilled in the art.

From the descriptions herein one skilled in the art can determinate that according to one embodiment, a circuit for programming a fuse element may comprise:

a memory cell, such as cell 12 for example, having a fuse element that includes a first semiconductor material, for example a doped semiconductor material, body region, for example region 54, and a silicide layer, for example layer 57 or material 58;

a programming circuit, for example circuit 25 or 125, configured to form a programming current, such as for example current 39, to program the fuse element; and a programming element, such as element 45 for example, configured to control a value of the programming current, the programming element having a second semiconductor material body region, for example region 49, but not a silicide layer.

An embodiment may include that a resistivity of the programming element is substantially representative of a resistivity of the first semiconductor material body region of the fuse element.

In an embodiment, the programming element may include a doped polysilicon body region that is substantially devoid of a silicide material.

Another embodiment may include that the programming circuit may include a means for forming a value of the programming current to cause electro-migration of silicide material overlying a portion of the first semiconductor material body region of the fuse element and increasing a resistivity of the fuse element.

In one embodiment, the programming element may include a plurality of coupled sections wherein each section of the plurality of sections is substantially equal.

An embodiment may include that the first and second semiconductor material body regions may include first and second polysilicon body regions.

In an embodiment, a resistivity of the programming element may be substantially representative of a resistivity of the first semiconductor material body region of the fuse element prior to alloying the silicide layer with the first material semiconductor body region.

Those skilled in the art will appreciate that an embodied of a method of forming a programming circuit for a fuse element may comprise:

forming a fuse element having a first semiconductor layer (such as layer 51 for example) and a silicide layer (for example one of or alternately all of layers 58-60) wherein the first semiconductor layer has a body region (such as region 54 for example) having a first resistivity, and the silicide layer has a second resistivity; and configuring a programming circuit to control a value of a programming current (such as current 39 for example) through the fuse element responsively to one of a cross-sectional area of a body region of a programming element or alternately a resistance of the programming element and not to current through a silicide material wherein the body region of the programming element is formed from a semiconductor material and wherein the value of the programming current causes an increase of a resistivity of the fuse element.

An embodiment of the method may include forming the configuring a programming circuit to control the value of the programming current to the first resistivity.

Another embodiment may include forming the body region of the programming element with a fourth resistivity that is substantially equal to the first resistivity.

An embodiment may include forming the programming current to not increase the fourth resistivity.

Those skilled in the art will appreciate that an embodied of a method of forming a programming circuit for a fuse element may comprise:

forming a fuse element, such as element 50 for example, having a first semiconductor layer for example layer 51, and a silicide layer, such as for example layer 57 or material 58, wherein the first semiconductor layer has a first resistivity and the silicide layer has a second resistivity; and configuring the programming circuit, such as circuit 25 or 125 for example, to control a value of a programming current through the fuse element using a programming element, such as for example element 45, having a third resistivity that is greater than the second resistivity.

An embodiment of the method may include forming the programming element to include a second semiconductor layer wherein the programming element is substantially devoid of a silicide layer and wherein the second semiconductor layer has substantially the first resistivity.

Another embodiment of the method may include configuring the control circuit to form the programming current to cause substantially a void in the silicide layer but not in the first semiconductor layer.

In an embodiment, the method may include configuring the control circuit to form the programming current to increase the first resistivity to a fourth resistivity and substantially not form a void in the first semiconductor layer.

Another embodiment may include configuring the control circuit to form the programming current with a value to increase the first resistivity to a fourth resistivity and to decrease the programming current to a second value responsively to forming the fourth resistivity wherein the second value is greater than zero.

Those skilled in the art will also appreciate that an embodied of a method of forming a programming circuit for a fuse element may comprise:

forming a fuse element, such as element 15 or element 50 for example, having a resistance, a first semiconductor layer, such as layer 51 for example, and a silicide layer, such as layer 57 or material 58, wherein the first semiconductor layer has a body region, such as for example region 54, having a body resistivity that is substantially a first resistivity, and the silicide layer has a second resistivity that is less than the first resistivity; and configuring a programming circuit, for example circuit 125 or 25, to control a value of a programming current, such as current 39 for example, through the fuse element responsively to a body region, region 49 for example, of a programming element, element 45 for example, wherein the body region is formed from a semiconductor material, such as polysilicon or doped polysilicon for example, and wherein the value of the programming current or alternately the programming current increases the resistance of the fuse element.

Another embodiment of the method may include forming the programming element with a third resistivity that is substantially equal to the first resistivity.

An embodiment of the method may include forming at least the body region of the programming element substantially devoid of a silicide material.

In an embodiment, the method may include forming the body region of the programming element from the semiconductor material that is substantially devoid of a silicide material.

An embodiment of the method may include configuring the programming circuit to cause electro-migration of silicide material and increase the resistance of the fuse element.

Another embodiment may include configuring the programming circuit to form the value of the programming current to result in a current density in the body region of the fuse element that causes electro-migration of silicide material.

An embodiment of the method may include configuring the programming circuit to control the value of the programming current to result in a current density in the body region of the fuse element that causes electro-migration of dopants in the body region of the fuse element.

Another embodiment may include configuring the programming circuit to form the value of the programming current to result in a current density of approximately 1E7 to 1E8 amps/cm$^2$ in the body region of the fuse element.

In view of all of the above, it is evident that a novel device and method is disclosed. Included, among other features, is forming a programming element without a silicide layer to control a value of a programming current through a silicide fuse element. In one embodiment, the programming circuit may be configured to increase a resistivity of the fuse element by removing at least a portion of a silicide material from a body region of the fuse element without causing an open circuit in a semiconductor material layer of the body region. Using a programming element that has a resistivity that is substantially similar to a resistivity of the semiconductor material layer of the body region of the fuse element assists in providing well controlled programming of the fuse elements and increases the final fuse resistance and yield and the reliability.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art. As will be appreciated by those skilled in the art, the example form of system 10 and circuit 25 are used as a vehicle to explain the programming function of increasing the resistivity without forming an open circuit in the fuse element. The subject matter has been described for a particular P-channel and N-channel transistor devices, although the method is directly applicable to bipolar transistors, as well as to other MOS, and other transistor devices.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A circuit for programming a fuse element comprising:
a memory cell having the fuse element that includes a first semiconductor material body region and a silicide layer;
a programming circuit configured to form a programming current to program the fuse element; and
a programming element configured to control a value of the programming current, the programming element having a second semiconductor material body region but not a silicide layer wherein a cross-sectional area of the second semiconductor material body region of the programming element is substantially the same as a cross-sectional area of the first semiconductor material body region of the fuse element;
the programming circuit configured to control the programming current to a first value responsively to a resistance of the programming element, the programming circuit subsequently controls the programming current to a different value responsively to a resistance of the fuse element.

2. The circuit of claim 1 wherein a resistivity of the programming element is substantially representative of a resistivity of the first semiconductor material body region of the fuse element.

3. The circuit of claim 1 wherein the programming element includes a doped polysilicon body region that is substantially devoid of a silicide material.

4. The circuit of claim 1 wherein the programming circuit includes a means for forming a value of the programming current to cause electro-migration of silicide material overlying a portion of the first semiconductor material body region of the fuse element and increasing a resistivity of the fuse element.

5. The circuit of claim 1 wherein the programming element includes a plurality of coupled sections.

6. The circuit of claim 1 wherein the first and second semiconductor material body regions includes first and second polysilicon body regions.

7. The circuit of claim 1 wherein a resistivity of the programming element is substantially representative of a resistivity of the first semiconductor material body region of the fuse element prior to alloying the silicide layer with the first material semiconductor body region.

8. A method of forming a programming circuit for a fuse element comprising:
forming the programming circuit to include a programming element having a first body region;
forming the fuse element having a second body region having a first semiconductor layer and a silicide layer wherein the first semiconductor layer has a first resistivity and the silicide layer has a second resistivity wherein a cross-sectional area of the first body region of the programming element is substantially the same as a cross-sectional area of the first semiconductor layer of the second body region of the fuse element; and
configuring the programming circuit to control a value of a programming current through the fuse element to a first value that causes electro-migration of a portion of the silicide layer of the fuse element, the programming circuit subsequently decreases the programming current to a second value that is greater than zero.

9. The method of claim 8 further including forming the programming element to include a second semiconductor layer having a third resistivity wherein the programming element is substantially devoid of a silicide layer.

10. The method of claim 8 wherein configuring the programming circuit to control the value of the programming current includes configuring a control circuit to form the programming current to cause substantially a void in the silicide layer but not in the first semiconductor layer.

11. The method of claim 9 further including configuring the control circuit to form the programming current to increase a resistivity of the second body region of the fuse element and substantially not form a void in the first semiconductor layer.

12. A method of forming an OTP programming circuit comprising:
  forming a fuse element having a resistance, a first semiconductor layer formed from a semiconductor material, and a silicide layer wherein the first semiconductor layer has a body region having a body resistivity that is substantially a first resistivity, and the silicide layer has a second resistivity that is less than the first resistivity; and
  configuring a programming circuit to control a value of a programming current through the fuse element responsively to a body region of a programming element wherein the body region of the programming element is formed from substantially the semiconductor material and has a third resistivity that is substantially equal to the first resistivity, wherein the programming current increases the resistance of the fuse element and wherein a cross-sectional area of the body region of the programming element is substantially the same as a cross-sectional area of the body region of the fuse element.

13. The method of claim 12 further including forming at least the body region of the programming element substantially devoid of a silicide layer.

14. The method of claim 12 further including forming the body region of the programming element from the semiconductor material that is substantially devoid of a silicide material.

15. The method of claim 12 wherein configuring the programming circuit to control the value of the programming current includes configuring the programming circuit to cause electro-migration of silicide material and increase the resistance of the fuse element.

16. The method of claim 12 wherein configuring the programming circuit to control the value of the programming current includes configuring the programming circuit to form the value of the programming current to result in a current density in the body region of the fuse element that causes electro-migration of silicide material.

17. The method of claim 12 wherein configuring the programming circuit to control the value of the programming current includes configuring the programming circuit to control the value of the programming current to result in a current density in the body region of the fuse element that causes electro-migration of dopants in the body region of the fuse element.

18. The method of claim 12 wherein configuring the programming circuit to control the value of the programming current includes configuring the programming circuit to form the value of the programming current to result in a current density of approximately 1E7 to 1E8 amps/cm$^2$ in the body region of the fuse element.

19. The method of claim 12 wherein configuring the programming circuit to control the value of the programming current includes configuring a control circuit to form the programming current with a value to increase the first resistivity to a fourth resistivity, the control circuit decreases the programming current to a second value responsively to forming the fourth resistivity wherein the second value is greater than zero.

20. A method of forming an OTP programming circuit comprising:
  forming a fuse element having a resistance, a first semiconductor layer formed from a semiconductor material, and a silicide layer wherein the first semiconductor layer has a body region having a body resistivity that is substantially a first resistivity, and the silicide layer has a second resistivity that is less than the first resistivity;
  configuring a programming circuit to control a value of a programming current through the fuse element responsively to a body region of a programming element wherein the body region of the programming element is formed from substantially the semiconductor material and has a third resistivity that is substantially equal to the first resistivity, wherein the programming current increases the resistance of the fuse element; and
  forming a cross-sectional area of the body region of the first semiconductor layer substantially the same as a cross-sectional area of the body region of the programming element wherein each cross-section is taken in a plane perpendicular to a direction of current flow through the body region of the first semiconductor layer and the body region of the programming element.

* * * * *